US 11,862,506 B2

(12) United States Patent
Amikura et al.

(10) Patent No.: US 11,862,506 B2
(45) Date of Patent: Jan. 2, 2024

(54) SUBSTRATE PROCESSING SYSTEM, VACUUM SUBSTRATE TRANSFER MODULE, AND SUBSTRATE TRANSFER METHOD

(71) Applicant: TOKYO ELECTRON LIMITED, Tokyo (JP)

(72) Inventors: Norihiko Amikura, Miyagi (JP); Masatomo Kita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 148 days.

(21) Appl. No.: 17/195,163

(22) Filed: Mar. 8, 2021

(65) Prior Publication Data

US 2021/0287927 A1    Sep. 16, 2021

(30) Foreign Application Priority Data

Mar. 11, 2020   (JP) ................................. 2020-041800

(51) Int. Cl.

| H01L 21/683 | (2006.01) |
| H01L 21/677 | (2006.01) |
| H01L 21/67 | (2006.01) |
| H01L 21/687 | (2006.01) |

(52) U.S. Cl.
CPC .... *H01L 21/6838* (2013.01); *H01L 21/67201* (2013.01); *H01L 21/67742* (2013.01); *H01L 21/68707* (2013.01)

(58) Field of Classification Search
CPC ........... H01L 21/68707; H01L 21/6838; H01L 21/68; H01L 21/37778; H01L 21/67201; H01L 21/67742; H01L 21/67748; H01L 21/67766

USPC .......................................................... 269/21
See application file for complete search history.

(56) References Cited

FOREIGN PATENT DOCUMENTS

| JP | 2011-91160 A | 5/2011 |
| JP | 2015-18875 A | 1/2015 |
| JP | 2019-201083 A | 11/2019 |
| WO | WO-2004075286 A1 * | 9/2004 ....... H01L 21/67742 |

OTHER PUBLICATIONS

WO-2004075286-A1 translation (Year: 2004).*

* cited by examiner

*Primary Examiner* — Tyrone V Hall, Jr.
*Assistant Examiner* — Abbie E Quann
(74) *Attorney, Agent, or Firm* — XSENSUS LLP

(57) ABSTRACT

A substrate processing system includes a substrate processing module, an atmospheric substrate transfer module, a first and a second vacuum substrate transfer module, a load lock module, and a vacuum substrate transfer robot. The first vacuum substrate transfer module having a first transfer space is disposed adjacent to the atmospheric substrate transfer module and the substrate processing module. The second vacuum substrate transfer module, having a second transfer space in communication with the first transfer space and external dimensions smaller than those of the first vacuum substrate transfer module in a plan view, is disposed on or under the first vacuum substrate transfer module. The load lock module is disposed between the atmospheric substrate transfer module and the second vacuum substrate transfer module. The vacuum substrate transfer robot is disposed in the first transfer space or the second transfer space to transfer a substrate.

7 Claims, 12 Drawing Sheets

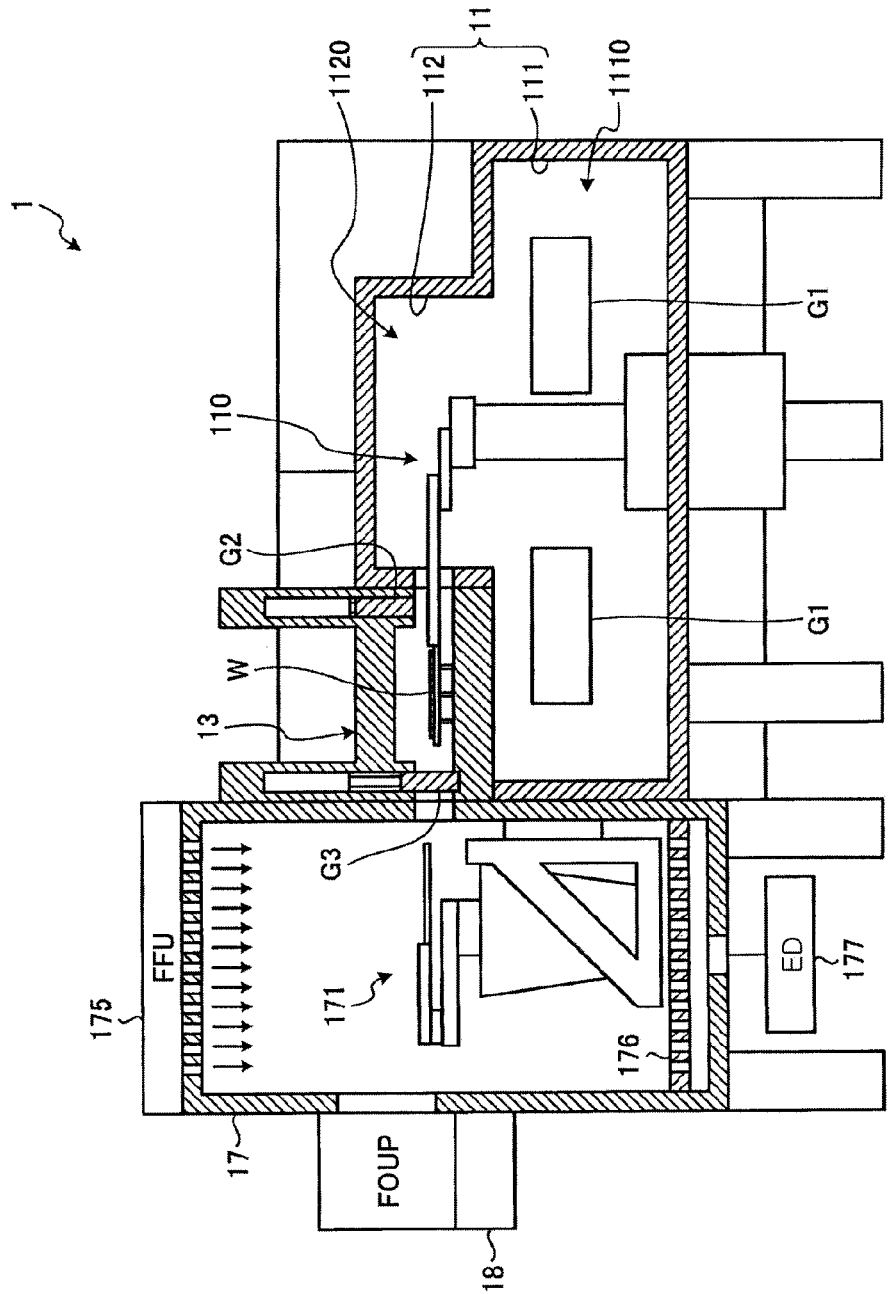

US 11,862,506 B2

SUBSTRATE PROCESSING SYSTEM, VACUUM SUBSTRATE TRANSFER MODULE, AND SUBSTRATE TRANSFER METHOD

CROSS-REFERENCE TO RELATED APPLICATIONS

This application claims priority to Japanese Patent Application No. 2020-041800, filed on Mar. 11, 2020, the entire contents of which are incorporated herein by reference.

TECHNICAL FIELD

Various aspects and embodiments of the present disclosure relate to a substrate processing system, a vacuum substrate transfer module, and a substrate transfer method.

BACKGROUND

Japanese Patent Application Publication No. 2015-18875 (JP2015-18875) discloses a semiconductor manufacturing apparatus including three carrier mounting stages on each of which a substrate transfer container that stores a predetermined number of wafers to be processed is mounted. The semiconductor manufacturing apparatus disclosed in JP2015-18875 includes a first transfer chamber in which a wafer is transferred under an atmospheric atmosphere. The semiconductor manufacturing apparatus disclosed in JP2015-18875 further includes, for example, two horizontally-arranged load lock chambers for holding the wafer therein while switching the internal atmosphere of each load lock chamber between an atmospheric atmosphere and a vacuum atmosphere. Further, the semiconductor manufacturing apparatus disclosed in JP2015-18875 includes a second transfer chamber in which the wafer is transferred under a vacuum atmosphere, and, for example, four processing modules for processing the loaded wafer. Further, JP2015-18875 discloses a transfer device installed in the first transfer chamber. The transfer device of JP2015-18875 has a base configured to be vertically movable and further movable along a longitudinal direction of the first transfer chamber by a driving mechanism, and thus transfer and receive the wafer between an alignment chamber and the substrate transfer container.

SUMMARY

The present disclosure provides a substrate processing system, a vacuum substrate transfer module, and a substrate transfer method capable of reducing an installation area of the substrate processing system.

In accordance with an aspect of the present disclosure, there is provided a substrate processing system including: a substrate processing module, an atmospheric substrate transfer module, a first vacuum substrate transfer module, a second vacuum substrate transfer module, a load lock module, and a vacuum substrate transfer robot.

The first vacuum substrate transfer module is disposed adjacent to the atmospheric substrate transfer module and the substrate processing module, and the first vacuum substrate transfer module has a first transfer space. The second vacuum substrate transfer module is disposed on or under the first vacuum substrate transfer module, and the second vacuum substrate transfer module has a second transfer space in communication with the first transfer space. Further, the second vacuum substrate transfer module has external dimensions smaller than external dimensions of the first vacuum substrate transfer module in a plan view. The load lock module is disposed between the atmospheric substrate transfer module and the second vacuum substrate transfer module. The vacuum substrate transfer robot is disposed in the first transfer space or the second transfer space. The vacuum substrate transfer robot is configured to transfer a substrate between the first transfer space and the substrate processing module at a first height, transfer the substrate between the first transfer space and the second transfer space, and transfer the substrate between the second transfer space and the load lock module at a second height different from the first height.

BRIEF DESCRIPTION OF THE DRAWINGS

The objects and features of the present disclosure will become apparent from the following description of embodiments, given in conjunction with the accompanying drawings, in which:

FIG. 12 is a cross-sectional view showing still another example of the substrate processing system.

DETAILED DESCRIPTION

Hereinafter, embodiments of the substrate processing system, the vacuum substrate transfer module, and the substrate transfer method will be described in detail with reference to the accompanying drawings. Further, the substrate processing system, the vacuum substrate transfer module, and the substrate transfer method to be described below are not limited by the following embodiments.

In order to increase the number of substrates that can be processed per unit time, it may be an option to increase the number of substrate processing modules that process the substrates. However, as the number of the substrate processing modules increases, a substrate processing system, which includes a plurality of substrate processing modules, a vacuum transfer module, a load lock module, an atmospheric substrate transfer module, and the like, becomes larger in size. When the size of the substrate processing system is increased, the installation area (footprint) of the substrate processing system in a facility such as a clean room is increased, which makes it difficult to arrange a plurality of substrate processing systems. Therefore, there is a demand for reducing the installation area of the substrate processing system.

Accordingly, the present disclosure provides a technique for reducing the installation area of the substrate processing system.

(Configuration of Substrate Processing System 1)

Figure 1:
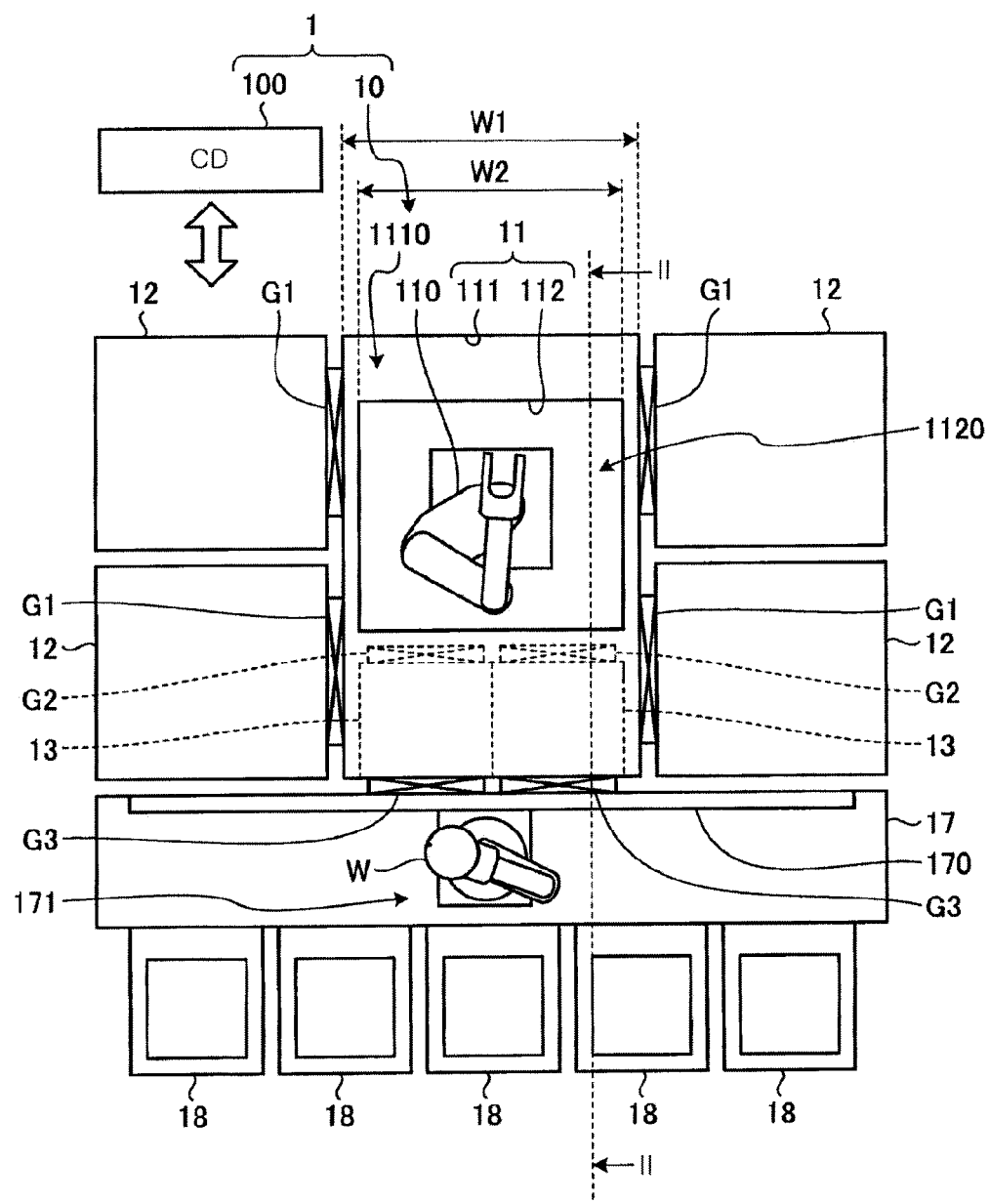
FIG. 1 is a plan view illustrating an example of a substrate processing system according to an embodiment.
Figure 2:
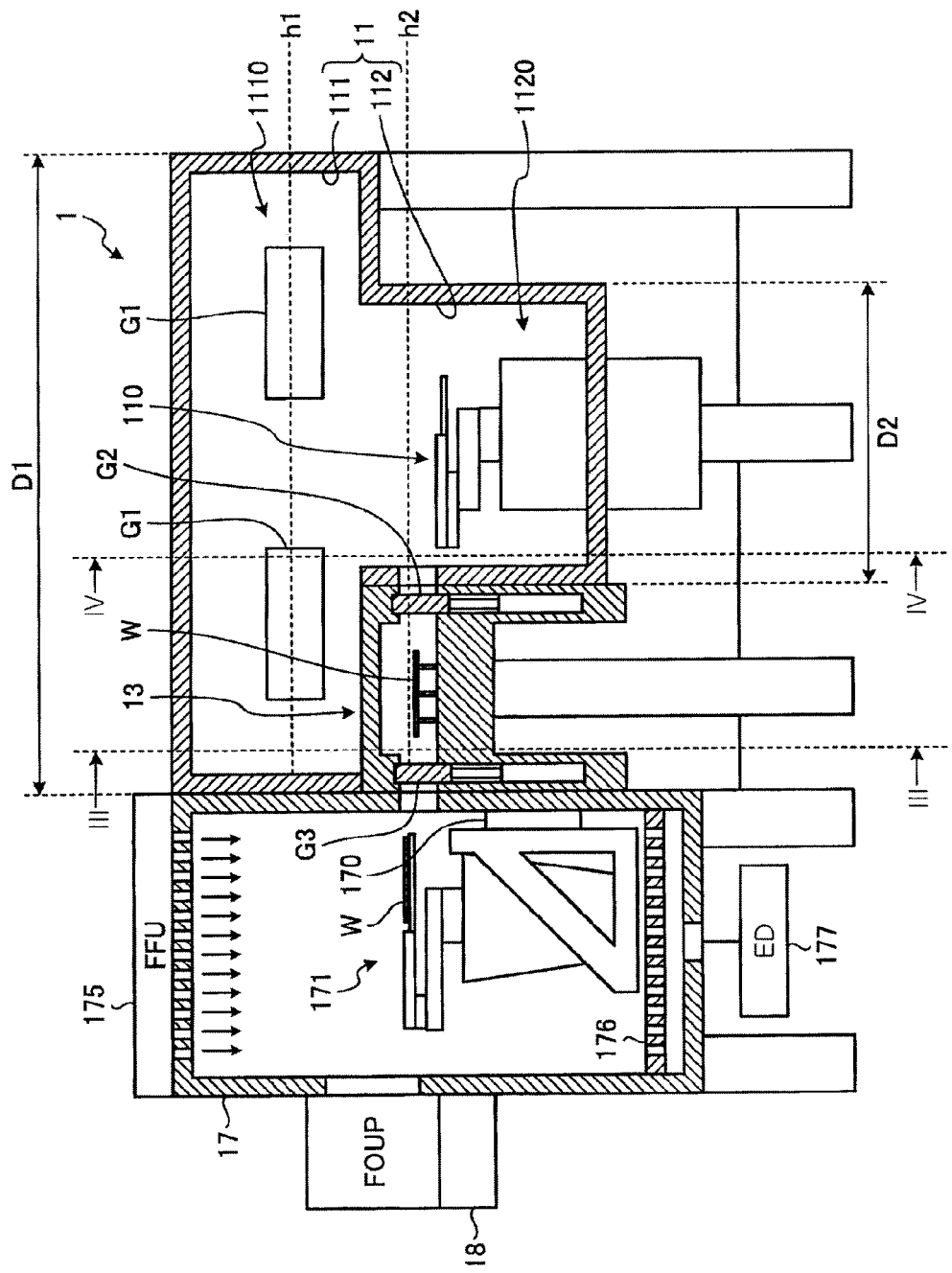
FIG. 2 is an example of a cross-sectional view taken along a broken line II-II of the substrate processing system 1 shown in FIG. 1.
Figure 3:
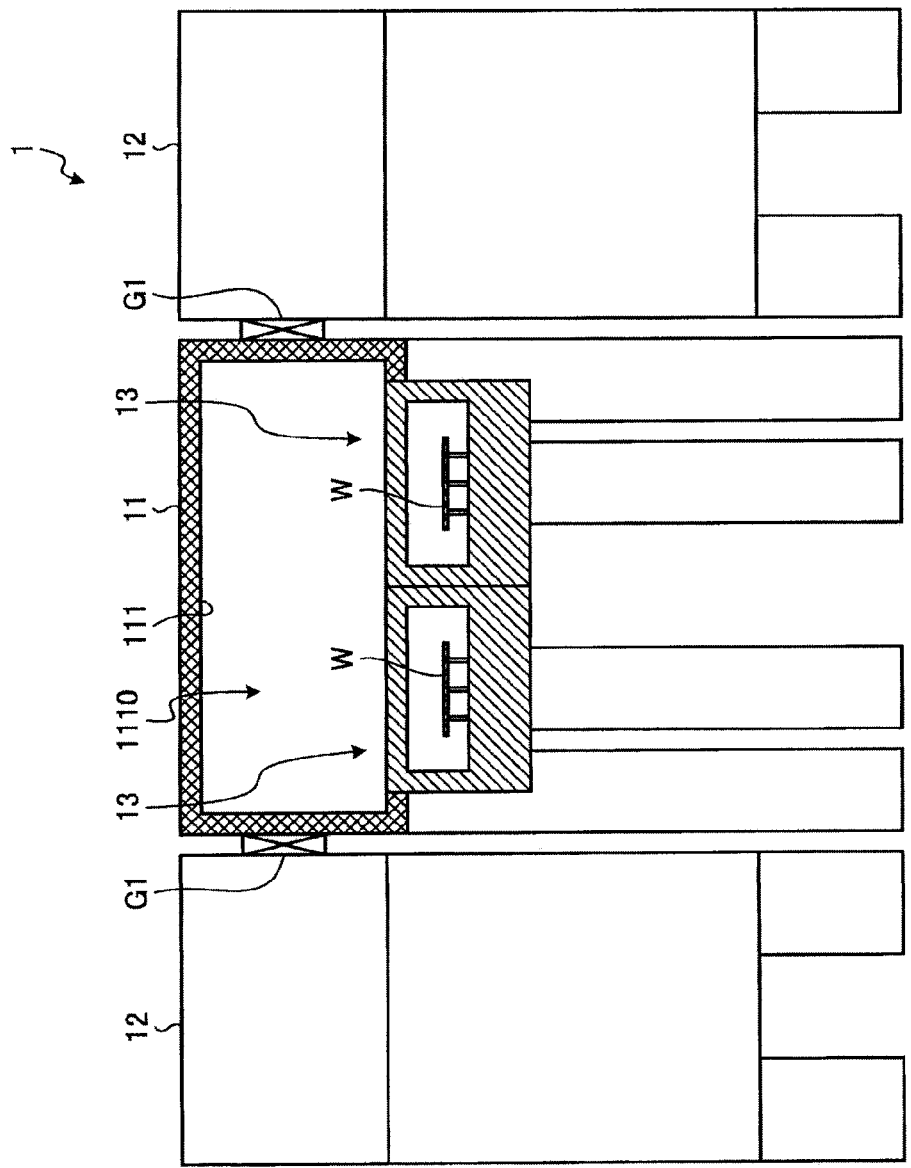
FIG. 3 is an example of a cross-sectional view taken along a broken line III-III of the substrate processing system 1 shown in FIG. 2.
Figure 4:
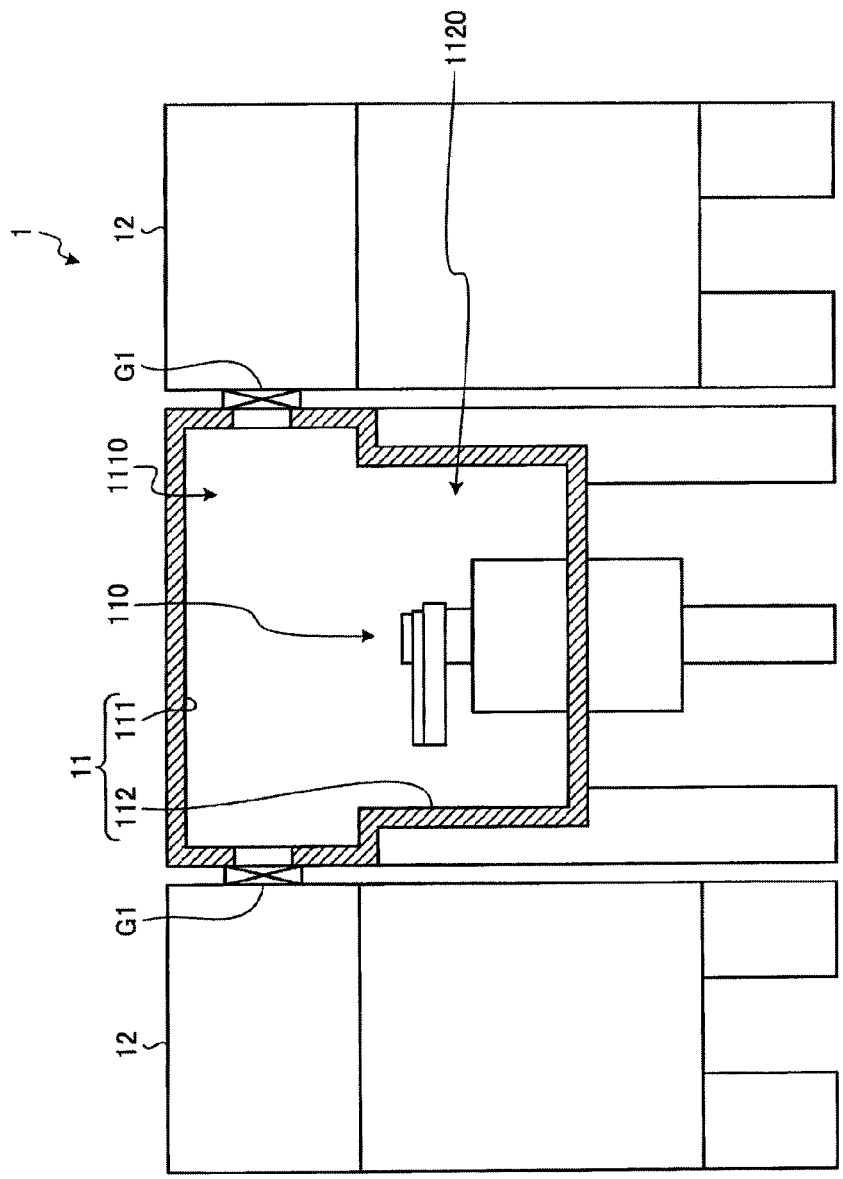
FIG. 4 is an example of a cross-sectional view taken along a broken line IV-IV of the substrate processing system 1 shown in FIG. 2.

FIG. 1 is a plan view illustrating an example of a configuration of a substrate processing system 1 according to an embodiment. FIG. 2 is an example of a cross sectional view taken along a broken line II-II of the substrate processing system 1 shown in FIG. 1. FIG. 3 is an example of a cross sectional view taken along a broken line III-III of the substrate processing system 1 shown in FIG. 2. FIG. 4 is an example of a cross sectional view taken along a broken line IV-IV of the substrate processing system 1 shown in FIG. 2. In FIG. 1, some internal components of devices are illustrated transparently for easier understanding. The substrate processing system 1 includes a main body 10 and a control device (CD) 100 that controls the main body 10.

The main body 10 includes a vacuum substrate transfer module 11, at least one (plurality in the example of FIG. 1) substrate processing module 12, at least one (plurality in the example of FIG. 1) load lock module 13, an atmospheric substrate transfer module 17, and at least one (plurality in the example of FIG. 1) load port 18. The substrate processing module 12 is an example of a first external module, and the load lock module 13 is an example of a second external module.

The vacuum substrate transfer module 11 includes a first vacuum substrate transfer module 111 and a second vacuum substrate transfer module 112. The first vacuum substrate transfer module 111 has a first transfer space 1110 for transferring the substrate W under a vacuum atmosphere. The first vacuum substrate transfer module 111 is arranged adjacent to the atmospheric substrate transfer module 17 and the plurality of substrate processing modules 12. In the present embodiment, the first vacuum substrate transfer module 111 has a substantially rectangular shape in a plan view and has first to fourth sidewalls. The atmospheric substrate transfer module 17 is arranged adjacent to the first sidewall of the first vacuum substrate transfer module 111. The first vacuum substrate transfer module 111 does not communicate with the atmospheric substrate transfer module 17. Each of the second sidewall and the third sidewall of the first vacuum substrate transfer module 111 is perpendicular to the first sidewall, and two substrate processing modules 12 are installed on each of the second sidewall and the third sidewall. The second vacuum substrate transfer module 112 is arranged under the first transfer space 1110. The second vacuum substrate transfer module 112 has a second transfer space 1120 for transferring the substrate W under a vacuum atmosphere. In the present embodiment, the second vacuum substrate transfer module 112 has a substantially rectangular shape in a plan view and has first to fourth sidewalls. The first sidewall of the second vacuum substrate transfer module 112 is located opposite to the atmospheric substrate transfer module 17, and at least one load lock module 13 is installed on the first sidewall of the second vacuum substrate transfer module 112. The second transfer space 1120 communicates with the first transfer space 1110. The first transfer space 1110 and the second transfer space 1120 may be integrally formed or separately formed. The external dimensions (outside dimension or overall size) of the second vacuum substrate transfer module 112 are smaller than the external dimensions of the first vacuum substrate transfer module 111 in a plan view (when viewed from the top-down view of FIGS. 1 to 4). In the present embodiment, for example, as shown in FIG. 1, a lateral dimension W2 of the second vacuum substrate transfer module 112 is equal to or smaller than a lateral dimension W1 of the first vacuum substrate transfer module 111. In the present embodiment, for example, as shown in FIG. 2, a depth dimension D2 of the second vacuum substrate transfer module 112 is smaller than a depth direction dimension D1 of the first vacuum substrate transfer module 111.

A transfer robot 110 is provided in the second transfer space 1120 of the second vacuum substrate transfer module 112. The transfer robot 110 is an example of a vacuum substrate transfer robot. The transfer robot 110 has an arm provided with an end effector for holding the substrate W at the tip end thereof. The transfer robot 110 is configured to transfer the substrate W between the respective substrate processing modules 12 and the first transfer space 1110 by moving the arm thereof. In the present embodiment, the transfer robot 110 horizontally transfers the substrate W between the respective substrate processing modules 12 and the first transfer space 1110 at a first height h1. Further, the transfer robot 110 is configured to transfer the substrate W between the first transfer space 1110 and the second transfer space 1120 by moving the arm thereof. In the present embodiment, the transfer robot 110 vertically transfers the substrate W between the first height h1 in the first transfer space 1110 and a second height h2 in the second transfer space 1120. Furthermore, the transfer robot 110 is configured to transfer the substrate W between the second transfer space 1120 and the respective load lock modules 13 by moving the arm thereof. In the present embodiment, the transfer robot 110 horizontally transfers the substrate W between the second transfer space 1120 and the respective load lock modules 13 at the second height h2. The interior of the first vacuum substrate transfer module 111 and the interior of the second vacuum substrate transfer module 112 of the vacuum substrate transfer module 11 may be maintained in a vacuum atmosphere (for example, a predetermined pressure lower than an atmospheric pressure, which may be referred to as "low pressure" in some cases described below).

A plurality of gate valves G1 are installed on the sidewalls of the first vacuum substrate transfer module 111. In the present embodiment, two substrate transfer openings are formed in each of the second sidewall and the third sidewall of the first vacuum substrate transfer module 111. The gate valves G1 are installed at the substrate transfer openings, respectively. Each gate valve G1 is disposed between the first vacuum substrate transfer module 111 and one substrate processing module 12, so that the first vacuum substrate transfer module 111 can be connected to (communicates with) the corresponding substrate processing module 12. The gate valve G1 is an example of a first substrate transfer gate. In the example of FIG. 1, although a case where the four substrate processing modules 12 are connected to the first vacuum substrate transfer module 111 is illustrated, the number of the substrate processing modules 12 connected to the first vacuum substrate transfer module 111 may be three or less or may be five or more.

Each substrate processing module 12 performs processing such as etching or film formation on the substrate W. In the present embodiment, the substrate processing module 12 performs plasma processing on the substrate W under a vacuum atmosphere. The substrate processing modules 12 may perform the same process or different processes in a manufacturing process.

For example, as shown in FIGS. 1 to 3, a plurality of gate valves G2 are installed on a side surface of the second vacuum substrate transfer module 112. In the present embodiment, two substrate transfer openings are formed in the first sidewall of the second vacuum substrate transfer module 112. The gate valves G2 are installed at the substrate transfer openings, respectively. Each gate valve G2 is disposed between the second vacuum substrate transfer module 112 and one load lock module 13, so that the second vacuum substrate transfer module 112 can be connected to (communicate with) the corresponding load lock module 13. The gate valve G2 is an example of a second substrate transfer gate. In the present embodiment, the plurality of load lock modules 13 are disposed under the first vacuum substrate transfer module 111 and between the second vacuum substrate transfer module 112 and the atmospheric substrate transfer module 17. In the examples of FIGS. 1 to 3, although a case where the two load lock modules 13 are connected to the second vacuum substrate transfer module 112 is illustrated, the number of the load lock modules 13 connected to the second vacuum substrate transfer module 112 may be one or may be three or more.

Further, gate valves G3 are installed on the load lock modules 13, respectively. Each gate valve G3 is disposed between the atmospheric substrate transfer module 17 and one load lock module 13. In the present embodiment, for example, as shown in FIG. 2, each gate valve G3 is arranged at the same height as the gate valve G2 installed on the corresponding load lock module 13. The gate valve G3 is an example of a third substrate transfer gate. In the present embodiment, the load lock module 13 has a substantially rectangular shape in a plan view and has first to fourth sidewalls. The second sidewall is located opposite to the first sidewall. A substrate transfer opening is formed in the first sidewall of the load lock module 13, and the gate valve G2 is installed at the substrate transfer opening. Further, a substrate transfer opening is formed in the second sidewall of the load lock module 13, and the gate valve G3 is installed at the substrate transfer opening.

After the substrate W is transferred from the atmospheric substrate transfer module 17 into the load lock module 13 via the gate valve G3, the corresponding substrate transfer opening is closed by driving the gate valve G3. Then, a pressure in the load lock module 13 may be lowered from the atmospheric pressure to a predetermined low pressure by an exhaust device (not shown). Then, the corresponding substrate transfer opening is opened by driving the gate valve G2, and the substrate W in the load lock module 13 is transferred into the second vacuum substrate transfer module 112.

Further, in a state in which the interior of the load lock module 13 is maintained at the low pressure (that is, in a vacuum atmosphere), the substrate W is transferred from the second vacuum substrate transfer module 112 to the load lock module 13 through the substrate transfer opening corresponding to the gate valve G2, and thereafter the corresponding substrate transfer opening is closed by driving the gate valve G2. Then, a gas (for example, air) may be supplied into the load lock module 13 using a gas supply device (not shown), thereby increasing the pressure in the load lock module 13 from the low pressure to the atmospheric pressure. Then, the substrate transfer opening corresponding to the gate valve G3 is opened by driving the gate valve G3, and the substrate W in the load lock module 13 is transferred into the atmospheric substrate transfer module 17.

On a sidewall of the atmospheric substrate transfer module 17 that is opposite to the sidewall of the atmospheric substrate transfer module 17 to which the load lock module 13 is connected, the plurality of load ports 18 are installed. A front opening unified pod (FOUP) for accommodating a plurality of substrates W is connected (mounted) to each load port 18.

A transfer robot 171 is provided in the atmospheric substrate transfer module 17. The transfer robot 171 is an example of an atmospheric substrate transfer robot. The transfer robot 171 is configured to transfer the substrate W between the atmospheric substrate transfer module 17 and the load lock module 13 through the substrate transfer opening corresponding to the gate valve G3. Further, the transfer robot 171 is configured to transfer the substrate W between the FOUP connected to the load port 18 and the load lock module 13. A guide rail 170 is provided on the sidewall of the atmospheric substrate transfer module 17 to which the load lock module 13 is connected. The transfer robot 171 moves back and forth in the atmospheric substrate transfer module 17 along the guide rail 170.

For example, as shown in FIG. 2, a fan filter unit (FFU) 75 is provided on an upper portion of the atmospheric substrate transfer module 17. The FFU 175 supplies air, from which particles and the like are removed (hereinafter referred to as "clean air"), into the atmospheric substrate transfer module 17 from the upper portion of the atmospheric substrate transfer module 17. A perforated floor 176 is provided at a bottom portion of the atmospheric substrate transfer module 17, and an exhaust device (ED) 177 for exhausting clean air in the atmospheric substrate transfer module 17 is connected to the bottom of the atmospheric substrate transfer module 17 below the perforated floor 176. The clean air supplied from the FFU 175 is exhausted by the exhaust device 177 through the perforated floor 176, so that a downflow of the clean air is formed in the atmospheric substrate transfer module 17. As a result, it is possible to suppress particles and the like from swirling upward in the atmospheric substrate transfer module 17. In addition, the exhaust device 177 may control a pressure in the atmospheric substrate transfer module 17 such that the interior of the atmospheric substrate transfer module 17 has a positive pressure. As a result, it is possible to suppress external particles and the like from entering the atmospheric substrate transfer module 17.

The control device 100 includes a memory, a processor, and an input/output interface. The memory stores data such as recipes, and programs. For example, the memory may include a random access memory (RAM), a read only memory (ROM), a hard disk drive (HDD), a solid state drive (SSD), or the like. The processor executes a program read from the memory to control each unit of the main body 10 through the input/output interface based on the data such as the recipe stored in the memory. The processor may be a central processing unit (CPU) or a digital signal processor (DSP).

As described above, in the present embodiment, the second vacuum substrate transfer module 112 is disposed under the first vacuum substrate transfer module 111 and has an outer diameter smaller than that of the first vacuum substrate transfer module 111 in a plan view. The load lock module 13 is connected to the side surface of the second vacuum substrate transfer module 112. As a result, the installation area of the substrate processing system 1 can be reduced as compared with the case where the load lock module 13 is disposed between the first vacuum substrate transfer module 111 and the atmospheric substrate transfer module 17.

(Transfer Method of Substrate W)

Figure 5:
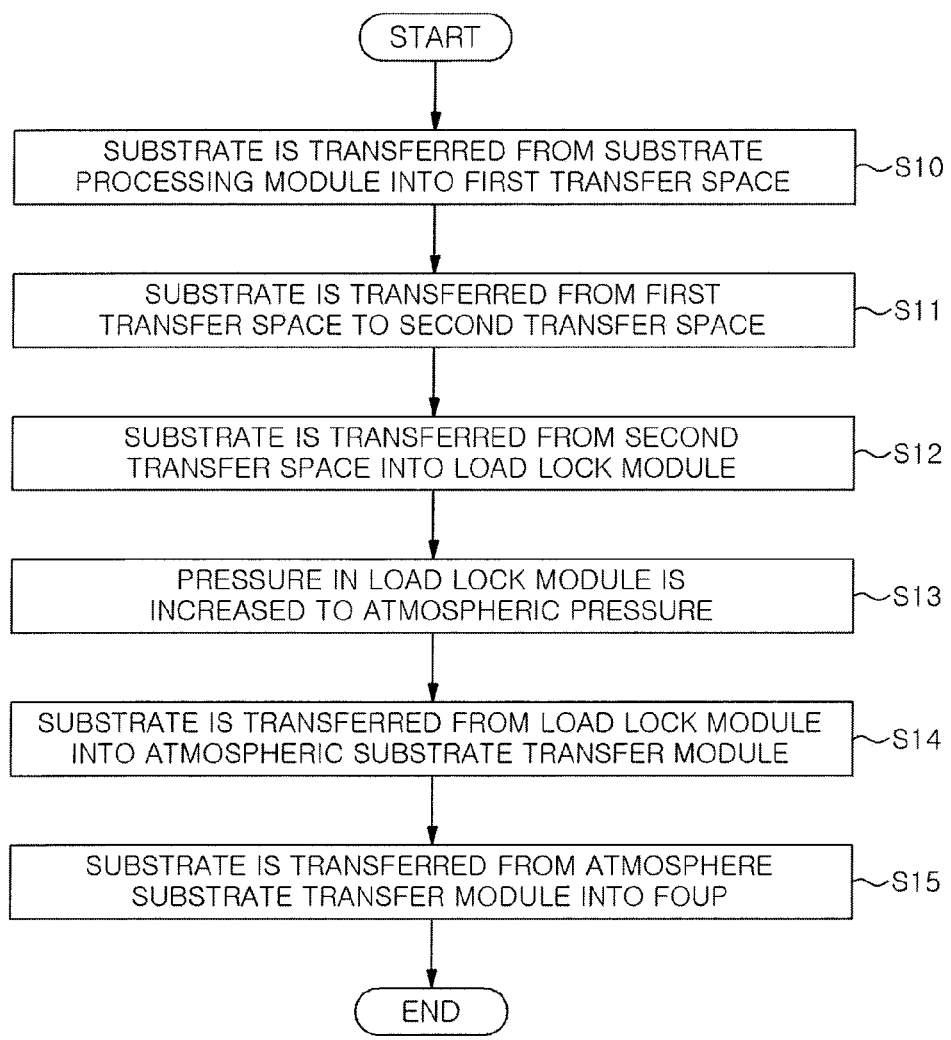
FIG. 5 is a flowchart showing an example of a substrate transport method.

FIG. 5 is a flowchart showing an example of a substrate transfer method. FIGS. 6 to 9 are cross-sectional views showing an example of the substrate processing system 1 when the substrate W is transferred. The process illustrated in FIG. 5 is realized by controlling each unit of the main body 10 by the control device 100. Although FIG. 5 shows a procedure for transferring the substrate W from the substrate processing module 12 to the FOUP, a procedure for transferring the substrate W from the FOUP to the substrate processing module 12 can be realized by performing the procedure of FIG. 5 in the reverse order.

Figure 6:
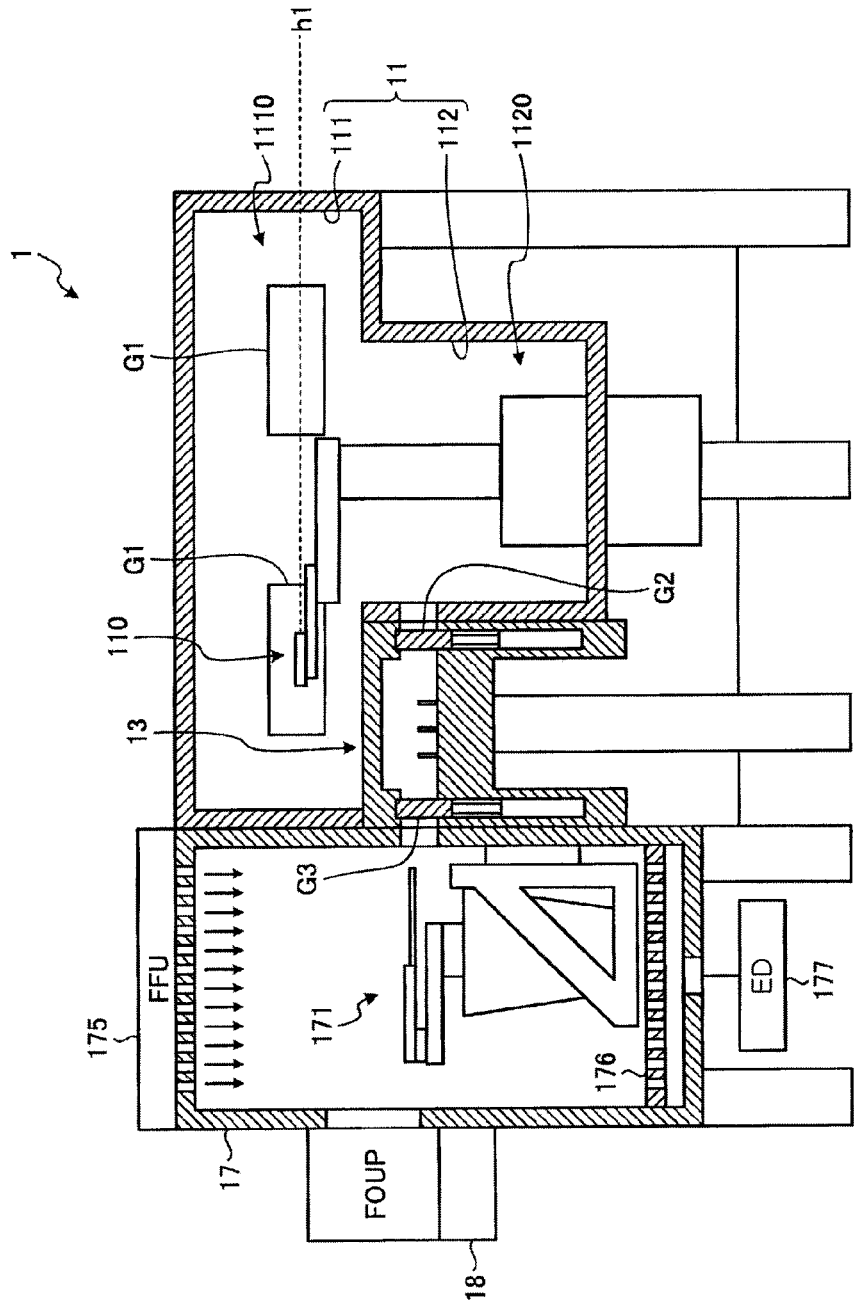
FIGS. 6 to 9 are cross-sectional views showing an example of the substrate processing system when a substrate is transferred.

First, the gate valve G1 is driven to open the substrate transfer opening corresponding thereto. Then, in an atmosphere (e.g., the vacuum atmosphere) where a pressure is lower than the atmospheric pressure, the transfer robot 110 transfers the substrate W from the inside of the substrate processing module 12 into the first transfer space 1110 through the substrate transfer opening corresponding to the gate valve G1 (step S10). Step S10 is an example of "(a) step." Then, the gate valve G1 is driven to close the substrate transfer opening corresponding thereto. For example, in step S10, the transfer robot 110 horizontally transfers the substrate W from the inside of the substrate processing module 12 to the first transfer space 1110 at the first height h1 through the substrate transfer opening corresponding to the gate valve G1, as shown in FIG. 6. The first height h1 is, for example, the height from the bottom surface of the second vacuum substrate transfer module 112.

Next, in the atmosphere where the pressure is lower than the atmospheric pressure, the transfer robot 110 vertically transfers the substrate W from the first height h1 in the first transfer space 1110 to the second height h2 in the second transfer space 1120 (step S11). Step S11 is an example of "(b) step." Then, the gate valve G2 is driven to open the substrate transfer opening corresponding thereto. Further, before the substrate transfer opening corresponding to the gate valve G2 is opened, the pressure inside the load lock module 13 is almost the same as the pressure (e.g., a vacuum atmosphere) inside the vacuum substrate transfer module 11.

Figure 7:
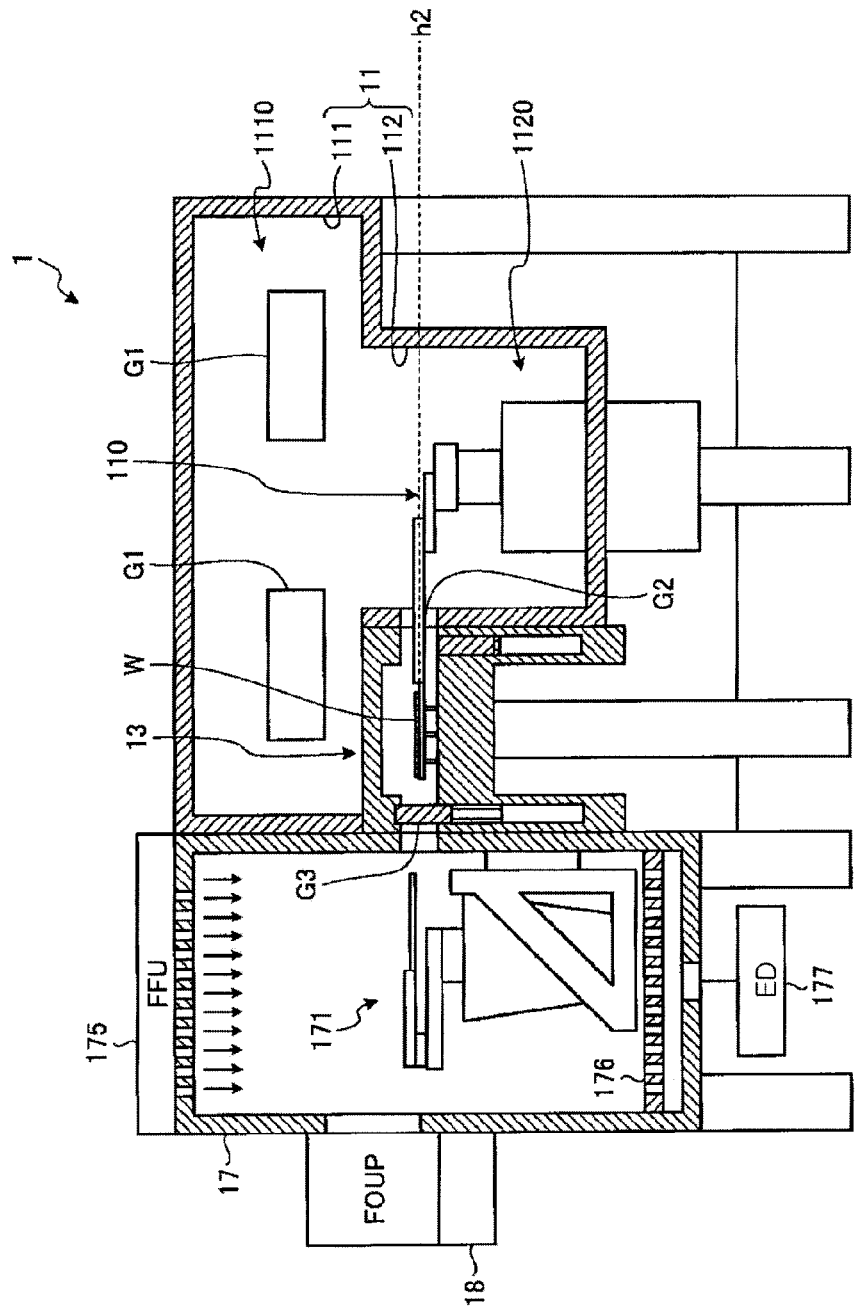

Next, in the atmosphere where the pressure is lower than the atmospheric pressure, the transfer robot 110 transfers the substrate W from the second transfer space 1120 into the load lock module 13 through the substrate transfer opening corresponding to the gate valve G2 (step S12). Step S12 is an example of "(c) step." Then, the transfer robot 110 retracts only the end effector from the load lock module 13 after placing the substrate W on a substrate support portion in the load lock module 13. For example, in step S12, the transfer robot 110 horizontally transfers the substrate W from the inside of the second transfer space 1120 to the inside of the load lock module 13 at the second height h2 through the substrate transfer opening corresponding to the gate valve G2, as shown in FIG. 7. The first height h1 is higher than the second height h2. The second height h2 is, for example, the height from the bottom surface of the second vacuum substrate transfer module 112.

Figure 8:
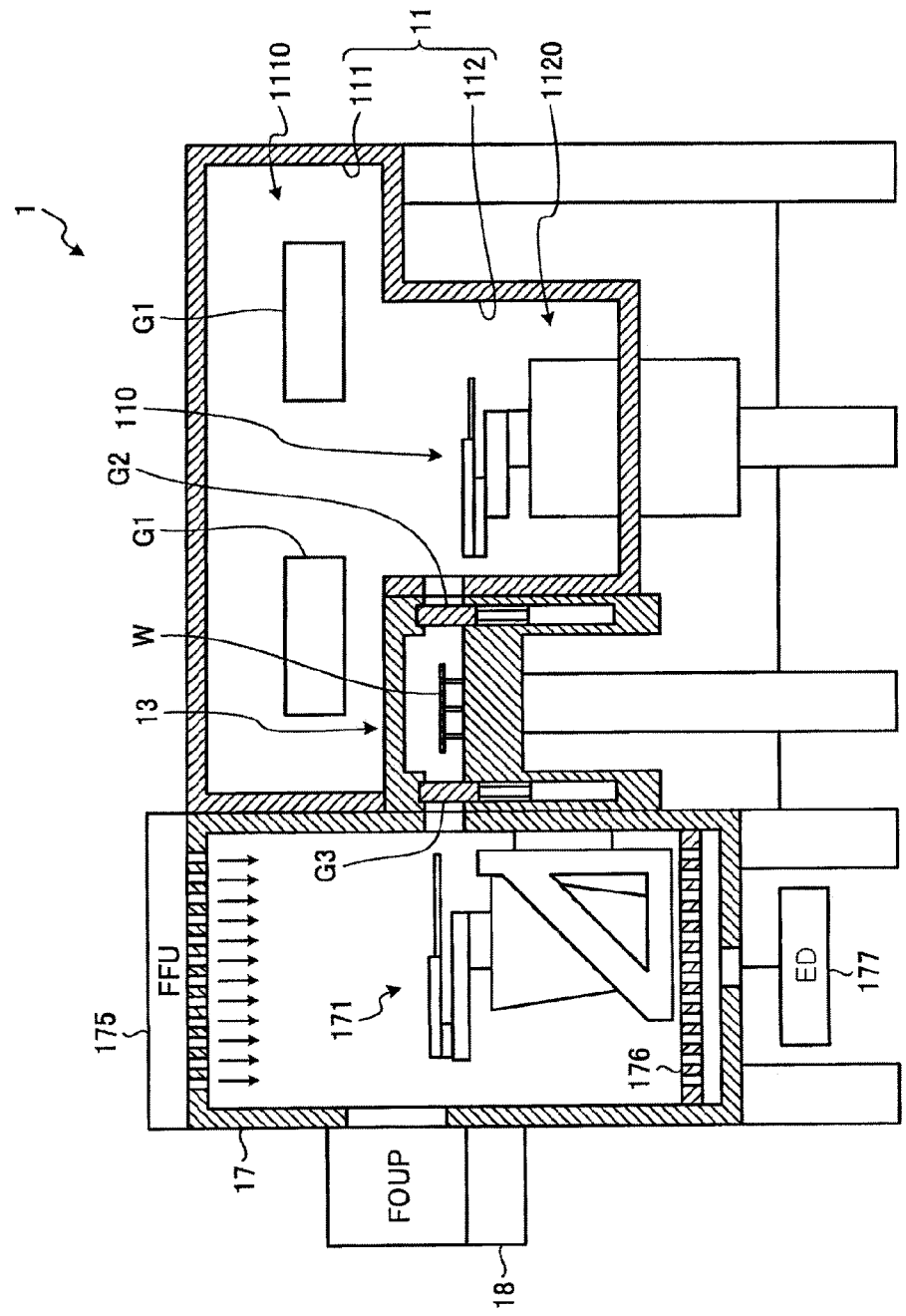

Next, for example, as shown in FIG. 8, the gate valve G2 is driven to close the substrate transfer opening corresponding thereto, and the pressure in the load lock module 13 is increased to the atmospheric pressure by a gas supply device (not shown) (step S13). Then, the gate valve G3 is driven to open the substrate transfer opening corresponding thereto.

Figure 9:
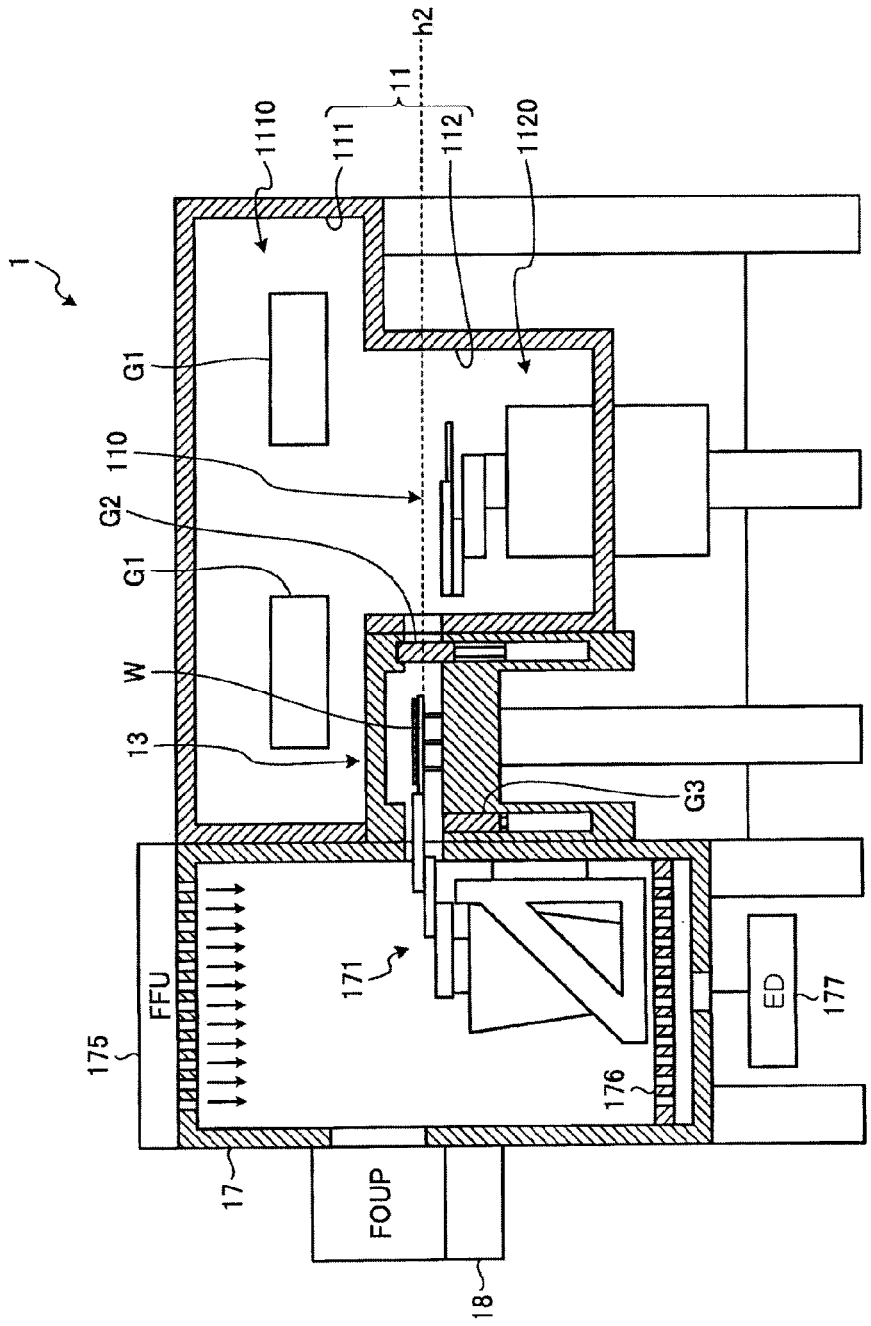

Next, for example, as shown in FIG. 9, in an atmospheric pressure atmosphere, the transfer robot 171 transfers the substrate W from the load lock module 13 into the atmospheric substrate transfer module 17 through the substrate transfer opening corresponding to the gate valve G3 (step S14). In step S14, the transfer robot 171 transfers the substrate W between the load lock module 13 and the atmospheric substrate transfer module 17 at the second height h2 through the substrate transfer opening corresponding to the gate valve G3. Step S14 is an example of "(d) step."

Next, under the atmospheric pressure atmosphere, the transfer robot 171 transfers the substrate W from the atmosphere substrate transfer module 17 into the FOUP (step S15). Then, the process shown in the flowchart of FIG. 5 is completed.

The first embodiment has been described above. As described above, the substrate processing system 1 in the present embodiment includes the substrate processing module 12, the atmospheric substrate transfer module 17, the first vacuum substrate transfer module 111, the second vacuum substrate transfer module 112, the load lock module 13, and a transfer robot 110. The first vacuum substrate transfer module 111 has the first transfer space 1110 and is disposed adjacent to the atmospheric substrate transfer module 17 and the substrate processing module 12. The second vacuum substrate transfer module 112 has the second transfer space 1120 communicating with the first transfer space 1110 and is disposed under the first vacuum substrate transfer module 111. The external dimensions of the second vacuum substrate transfer module 112 are smaller than the external dimensions of the first vacuum substrate transfer module 111 in a plan view. The load lock module 13 is disposed between the atmospheric substrate transfer module 17 and the second vacuum substrate transfer module 112. The transfer robot 110 is disposed in the second transfer space 1120 and is configured to transfer the substrate W between the first transfer space 1110 and the substrate processing module 12 at the first height h1. Further, the transfer robot 110 is configured to transfer the substrate W between the first transfer space 1110 and the second transfer space 1120. Further, the transfer robot 110 is configured to transfer the substrate W between the second transfer space 1120 and the load lock module 13 at the second height h2 different from the first height h1. Therefore, the installation area of the substrate processing system 1 can be reduced.

Further, in the first embodiment described above, the second vacuum substrate transfer module 112 is disposed under the first vacuum substrate transfer module 111, and the first height h1 is higher than the second height h2. Therefore, the load lock module 13 can be easily disposed between the vacuum substrate transfer module 11 and the atmospheric substrate transfer module 17.

Further, in the first embodiment described above, the transfer robot 110 is disposed in the second transfer space 1120. Therefore, the first vacuum substrate transfer module 111 can be made smaller.

Further, the substrate processing system 1 according to the first embodiment described above further includes the transfer robot 171 that is disposed in the atmospheric substrate transfer module 17 and is configured to transfer the substrate W between the atmospheric substrate transfer module 17 and the load lock module 13. Therefore, the substrate W can be transferred between the atmospheric substrate transfer module 17 and the load lock module 13.

Further, in the first embodiment described above, the transfer robot 171 is configured to transfer the substrate W between the atmospheric substrate transfer module 17 and the load lock module 13 at the second height h2. Therefore, the substrate W can be transferred between the atmospheric board transfer module 17 and the load lock module 13 that is connected to the second vacuum substrate transfer module 112 disposed under the first vacuum substrate transfer module 111.

Further, the vacuum substrate transfer module 11 in the first embodiment described above includes the first vacuum substrate transfer module 111, the second vacuum substrate transfer module 112, and the transfer robot 110. The first vacuum substrate transfer module 111 has the first transfer space 1110. The second vacuum substrate transfer module 112 has the second transfer space 1120 communicating with the first transfer space 1110 and is disposed under the first vacuum substrate transfer module 111. The external dimensions of the second vacuum substrate transfer module 112 are smaller than the external dimensions of the first vacuum substrate transfer module 111 in a plan view. The transfer robot 110 is disposed in the first transfer space 1110 or the second transfer space 1120. Further, the transfer robot 110 transfers the substrate W between the first transfer space 1110 and the substrate processing module 12 at the first height h1, transfers the substrate W between the first transfer space 1110 and the second transfer space 1120, and transfers the substrate W between the second transfer space 1120 and the load lock module 13 at the second height h2 different from the first height h1. Therefore, the installation area of the substrate processing system 1 including the vacuum substrate transfer module 11 can be reduced.

Further, the substrate transfer method in the first embodiment described above includes (a) transferring the substrate W between the first vacuum substrate transfer module 111 and the substrate processing module 12 at the first height h1 in a vacuum atmosphere, (b) transferring the substrate W between the first vacuum substrate transfer module 111 and the second vacuum substrate transfer module 112 in a vacuum atmosphere, the second vacuum substrate transfer module 112 being disposed under the first vacuum substrate transfer module 111 and having the external dimensions smaller than the external dimensions of the first vacuum substrate transfer module 111 in a plan view, (c) transferring the substrate W between the second vacuum substrate transfer module 112 and the load lock module 13 at the second height h2 different from the height h1 in a vacuum atmosphere, the load lock module 13 being disposed between the second vacuum substrate transfer module 112 and the atmospheric substrate transfer module 17, and (d) transferring the substrate W between the load lock module 13 and the atmospheric substrate transfer module 17 in an atmospheric pressure atmosphere. Therefore, the substrate W can be transferred in the substrate processing system 1 having a small installation area.

OTHER EMBODIMENTS

The technique described in the present disclosure is not limited to the above-described embodiment and can be modified in various ways within the scope of the present disclosure.

Figure 10:
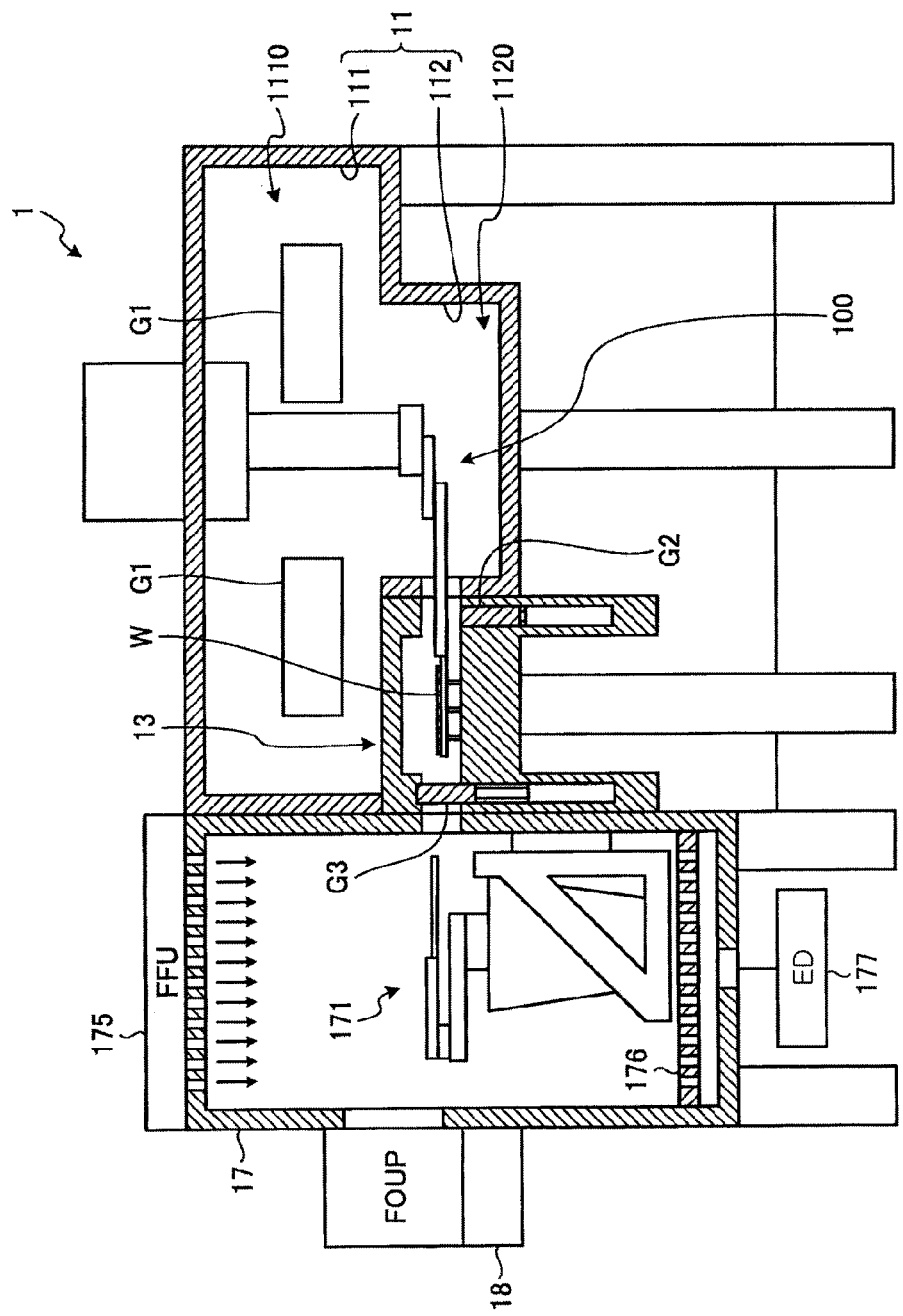
FIG. 10 is a cross-sectional view showing another example of the substrate processing system.

For example, in the above-described embodiment, the transfer robot 110 is disposed in the second transfer space 1120 of the second vacuum substrate transfer module 112. However, the present disclosure is not limited thereto. For example, as another embodiment, the transfer robot 110 may be disposed in the first transfer space 1110 of the first vacuum substrate transfer module 111 as shown in an example of FIG. 10. Even with such a configuration, the transfer robot 110 can transfer the substrate W among the respective substrate processing modules 12, the first transfer space 1110, the second transfer space 1120, and the respective load lock modules 13.

Figure 11:
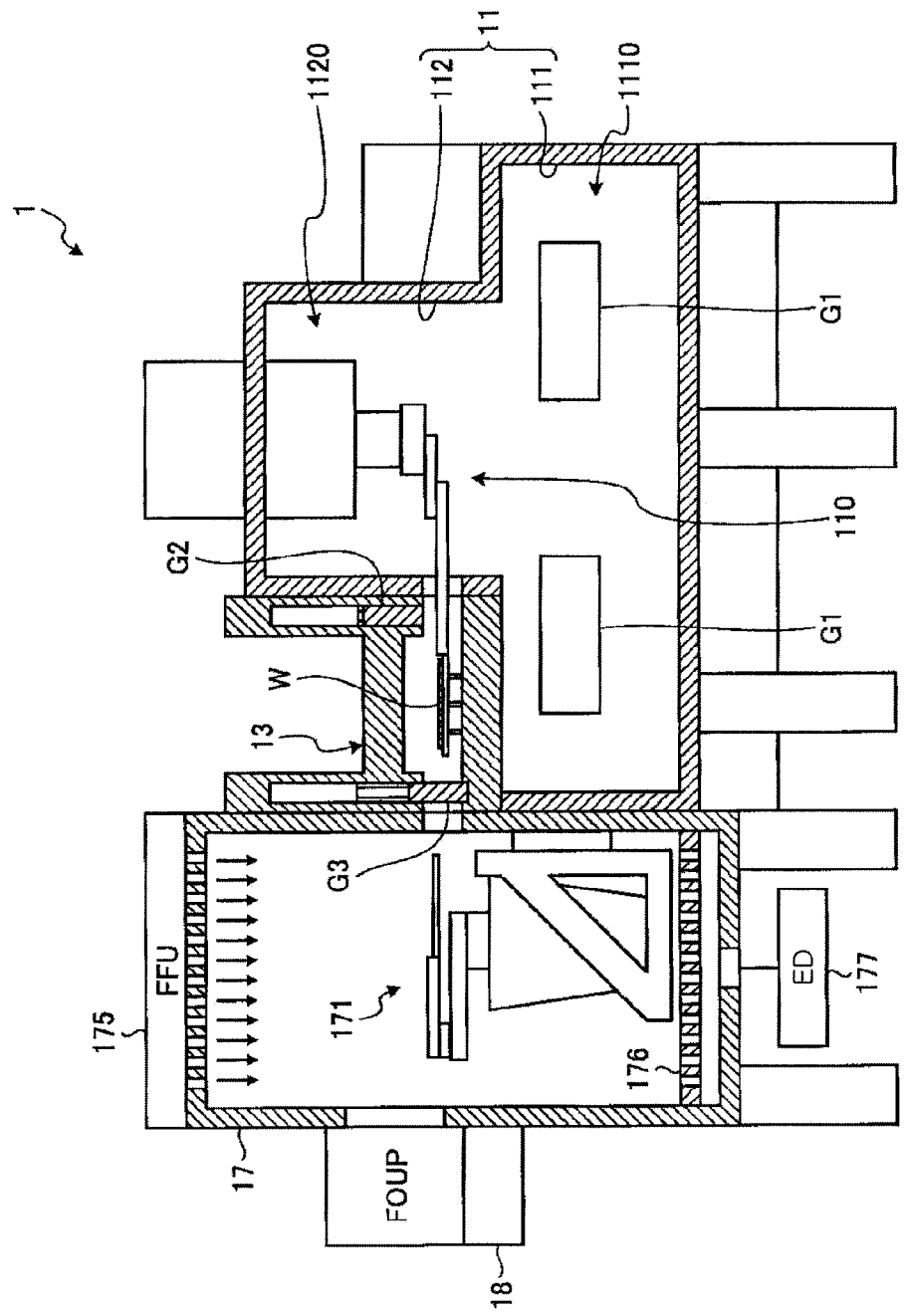
FIG. 11 is a cross-sectional view showing still another example of the substrate processing system.

Further, in the above-described embodiment, the second vacuum substrate transfer module 112 is disposed under the first vacuum substrate transfer module 111. However, the present disclosure is not limited thereto. For example, as another embodiment, the second vacuum substrate transfer module 112 may be disposed on the first vacuum substrate transfer module 111 as shown in an example of FIG. 11. In the example of FIG. 11, the transfer robot 110 is disposed in the second transfer space 1120 of the second vacuum substrate transfer module 112, and the load lock module 13 is also disposed on the first vacuum substrate transfer module 111. Even with such a configuration, the installation area of the substrate processing system 1 can be reduced. Alternatively, for example, in the substrate processing system 1 shown in FIG. 11, the transfer robot 110 may be disposed in the first transfer space 1110 of the first vacuum substrate transfer module 111 as shown in an example of FIG. 12.

Further, in the above-described embodiment, the plurality of load lock modules 13 are disposed under the first vacuum substrate transfer module 111. However, the present disclosure is not limited thereto. For example, as another embodiment, at least one load lock module 13 may be disposed on and under the first vacuum substrate transfer module 111. In this case, the second vacuum substrate transfer module 112 is disposed on and under the first vacuum substrate transfer module 111. The second transfer space 1120 of the second vacuum substrate transfer module 112 disposed on the first vacuum substrate transfer module 111 communicates with the first transfer space 1110 of the first vacuum substrate transfer module 111. Further, the second transfer space 1120 of the second vacuum substrate transfer module 112 disposed on the first vacuum substrate transfer module 111 communicates with the interior of the load lock module 13 disposed on the first vacuum substrate transfer module 111. Further, the second transfer space 1120 in the second vacuum substrate transfer module 112 disposed under the first vacuum substrate transfer module 111 communicates with the first transfer space 1110 of the first vacuum substrate transfer module 111. In addition, the second transfer space 1120 of the second vacuum substrate transfer module 112 disposed under the first vacuum substrate transfer module 111 communicates with the interior of the load lock module 13 disposed under the first vacuum substrate transfer module 111.

Further, in the above-described embodiment, the substrate W is transferred among the vacuum substrate transfer module 11, the plurality of load lock modules 13, and the atmospheric substrate transfer module 17. However, the present disclosure is not limited thereto. As another embodiment, an edge ring in addition to the substrate W can be transferred among the vacuum substrate transfer module 11, the plurality of load lock modules 13, and the atmospheric substrate transfer module 17. In this case, the transfer robot 110 and the transfer robot 171 transfer the edge ring in addition to the substrate W. Each substrate processing module 12 is provided with a stage on which the substrate W is placed, and the stage includes the edge ring so as to surround the substrate W. Since the edge ring is consumed through processing such as etching of the substrate W, the edge ring is replaced at a predetermined timing.

The presently disclosed embodiments are considered in all respects to be illustrative and are not restrictive. The above-described embodiments can be embodied in various forms. Further, the above-described embodiments may be omitted, replaced, or changed in various forms without departing from the scope of the appended claims and the gist thereof.

The invention claimed is:

1. A substrate processing system comprising:
a substrate processing module;
an atmospheric substrate transfer module;
a first vacuum substrate transfer module disposed adjacent to the atmospheric substrate transfer module and the substrate processing module, the first vacuum substrate transfer module having a first transfer space;
a second vacuum substrate transfer module disposed under the first vacuum substrate transfer module, the second vacuum substrate transfer module having a second transfer space in communication with the first transfer space, the second vacuum substrate transfer module having external dimensions smaller than external dimensions of the first vacuum substrate transfer module in a plan view;
a load lock module disposed between the atmospheric substrate transfer module and the second vacuum substrate transfer module; and
a vacuum substrate transfer robot disposed in the first transfer space or the second transfer space, the vacuum substrate transfer robot being configured to
transfer a substrate between the first transfer space and the substrate processing module at a first height,
transfer the substrate between the first transfer space and the second transfer space, and
transfer the substrate between the second transfer space and the load lock module at a second height different from the first height, wherein the first height is higher than the second height.

2. The substrate processing system of claim 1, wherein the vacuum substrate transfer robot is disposed in the second transfer space.

3. The substrate processing system of claim 2, further comprising: an atmospheric substrate transfer robot disposed in the atmospheric substrate transfer module and configured to transfer the substrate between the atmospheric substrate transfer module and the load lock module.

4. The substrate processing system of claim 1, further comprising: an atmospheric substrate transfer robot disposed in the atmospheric substrate transfer module and configured to transfer the substrate between the atmospheric substrate transfer module and the load lock module.

5. The substrate processing system of claim 4, wherein the atmospheric substrate transfer robot is configured to transfer the substrate between the atmospheric substrate transfer module and the load lock module at the second height.

6. A vacuum substrate transfer module comprising:
an atmospheric substrate transfer module; a first vacuum substrate transfer module having a first transfer space;
a second vacuum substrate transfer module disposed under the first vacuum substrate transfer module, the second vacuum substrate transfer module having a second transfer space in communication with the first transfer space, the second vacuum substrate transfer module having external dimensions smaller than external dimensions of the first vacuum substrate transfer module in a plan view; a load lock module disposed between the atmospheric substrate transfer module and the second vacuum substrate transfer module; and
a vacuum substrate transfer robot disposed in the first transfer space or the second transfer space, the vacuum substrate transfer robot being configured to
transfer a substrate between the first transfer space and a first external module at a first height,
transfer the substrate between the first transfer space and the second transfer space, and
transfer the substrate between the second transfer space and a second external module at a second height different from the first height, wherein the first height is higher than the second height.

7. A substrate transfer method comprising:
(a) transferring a substrate between a first vacuum substrate transfer module and a substrate processing module at a first height in a vacuum atmosphere;
(b) transferring the substrate between the first vacuum substrate transfer module and a second vacuum substrate transfer module in a vacuum atmosphere, the second vacuum substrate transfer module being disposed under the first vacuum substrate transfer module and having external dimensions smaller than external dimensions of the first vacuum substrate transfer module in a plan view;
(c) transferring the substrate between the second vacuum substrate transfer module and a load lock module at a second height different from the first height in the vacuum atmosphere, the load lock module being disposed between the second vacuum substrate transfer module and an atmospheric substrate transfer module, wherein the first height is higher than the second height; and
(d) transferring the substrate between the load lock module and the atmospheric substrate transfer module in an atmospheric pressure atmosphere.

* * * * *